US011243297B2

(12) United States Patent
Gilliland et al.

(10) Patent No.: US 11,243,297 B2
(45) Date of Patent: Feb. 8, 2022

(54) METHODS AND SYSTEMS FOR TESTING BONDING OF A SENSOR ASSEMBLY

(71) Applicant: Continental Automotive Systems, Inc., Auburn Hills, MI (US)

(72) Inventors: Patrick B Gilliland, Santa Barbara, CA (US); Heiko Leppin, Hergensweiler (DE)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 16/225,838

(22) Filed: Dec. 19, 2018

(65) Prior Publication Data

US 2020/0200883 A1 Jun. 25, 2020

(51) Int. Cl.
*G01S 7/497* (2006.01)
*G01R 31/66* (2020.01)

(52) U.S. Cl.
CPC .............. *G01S 7/497* (2013.01); *G01R 31/66* (2020.01)

(58) Field of Classification Search
CPC .......................... G01S 7/497; G01R 31/50–74
USPC ......................................................... 324/511
See application file for complete search history.

(56) References Cited

U.S. PATENT DOCUMENTS

| | | | | |
|---|---|---|---|---|
| 2009/0058435 A1* | 3/2009 | Nakamura | ............. | G01R 31/71 324/719 |
| 2012/0032693 A1* | 2/2012 | Xue | ................... | G01R 31/2896 324/693 |
| 2012/0105085 A1 | 5/2012 | Chen et al. | | |
| 2012/0268147 A1* | 10/2012 | Chen | ...................... | G01R 31/71 324/713 |
| 2014/0375977 A1 | 12/2014 | Ludwig et al. | | |
| 2015/0015281 A1* | 1/2015 | Bogner | .................. | G01R 27/20 324/705 |
| 2015/0241504 A1* | 8/2015 | Mutnury | ................ | G01R 31/71 324/538 |
| 2016/0202298 A1 | 7/2016 | Brahma et al. | | |
| 2016/0266242 A1* | 9/2016 | Gilliland | ............... | G01S 7/4814 |
| 2017/0243797 A1* | 8/2017 | Kim | ........................ | H01L 22/34 |

OTHER PUBLICATIONS

International Search Report and Written Opinion of the International Searching Authority dated Mar. 23, 2020 for the counterpart PCT Application No. PCT/2019/067344.

\* cited by examiner

*Primary Examiner* — Judy Nguyen
*Assistant Examiner* — Rahul Maini (57) ABSTRACT

A lidar sensor assembly includes a detector array having a plurality of photodetectors. An integrated circuit is bonded to the detector array via a plurality of connection bumps. A reference trace is defined by conductive material on at least one of the integrated circuit and the detector array. A test trace is defined by conductive material on the detector array, at least two of the connection bumps, and conductive material on the integrated circuit. A resistance measuring device is configured to independently measure a reference resistance along the reference trace and a test resistance along the test trace. The assembly also includes a processor in communication with the resistance measuring device. The processor is configured to receive the reference resistance and the test resistance, subtract the reference resistance from the test resistance to produce a bond resistance, and compare the bond resistance to a predetermined resistance value.

16 Claims, 6 Drawing Sheets

FIG. 6

METHODS AND SYSTEMS FOR TESTING BONDING OF A SENSOR ASSEMBLY

TECHNICAL FIELD

The technical field relates generally to methods and systems for testing bonding of a sensor assembly and more particularly to methods and systems for testing electrical and mechanical bonding of connection bumps in a lidar sensor assembly

BACKGROUND

Flash lidar and other sensors are often constructed using flip-chip techniques. Specifically, many flash lidar sensors include a detector array that is bonded with a plurality of connection bumps to an integrated circuit. The connection bumps allow for both an electrical and mechanical connection between the detector array and integrated circuit.

Unfortunately, over time, the electrical and/or mechanical bonding properties of these connection bumps may degrade. This degradation may be accelerated when the sensor is used in harsh environments, such as exposure to vibrations, hot and cold temperatures, etc., which may occur when the sensor is used in a motor vehicle.

When utilized with autonomous or semi-autonomous driving, constant and predictable performance of the flash lidar sensor is important. As such, it is desirable to present a method and system for testing the bonding of a sensor assembly. In addition, other desirable features and characteristics will become apparent from the subsequent summary and detailed description, and the appended claims, taken in conjunction with the accompanying drawings and this background.

BRIEF SUMMARY

In one exemplary embodiment, a method of testing bonding of a sensor assembly includes measuring a reference resistance along a reference trace defined by conductive material on at least one of an integrated circuit and a detector array. The method also includes measuring a test resistance along a test trace defined by conductive material on the integrated circuit, conductive material on the detector array, and at least two connection bumps bonding the detector array to the integrated circuit. The method further includes subtracting the reference resistance from the test resistance to determine a bond resistance with a processor. The method also includes comparing the bond resistance to a predetermined resistance value.

In one exemplary embodiment, a lidar sensor assembly includes a detector array having a plurality of photodetectors. The assembly also includes an integrated circuit bonded to the detector array via a plurality of connection bumps. The assembly further includes a reference trace defined by conductive material on at least one of the integrated circuit and the detector array. The assembly also includes a test trace defined by conductive material on the detector array, at least two of the connection bumps, and conductive material on the integrated circuit. A resistance measuring device is configured to independently measure a reference resistance along the reference trace and a test resistance along the test trace. The assembly also includes a processor in communication with the resistance measuring device. The processor is configured to receive the reference resistance and the test resistance, subtract the reference resistance from the test resistance to produce a bond resistance, and compare the bond resistance to a predetermined resistance value.

BRIEF DESCRIPTION OF THE DRAWINGS

Other advantages of the disclosed subject matter will be readily appreciated, as the same becomes better understood by reference to the following detailed description when considered in connection with the accompanying drawings wherein.

DETAILED DESCRIPTION

Referring to the Figures, wherein like numerals indicate like parts throughout the several views, a lidar sensor assembly 100 and method 600 for testing the lidar sensor assembly 100 are shown and described herein.

Figure 1:
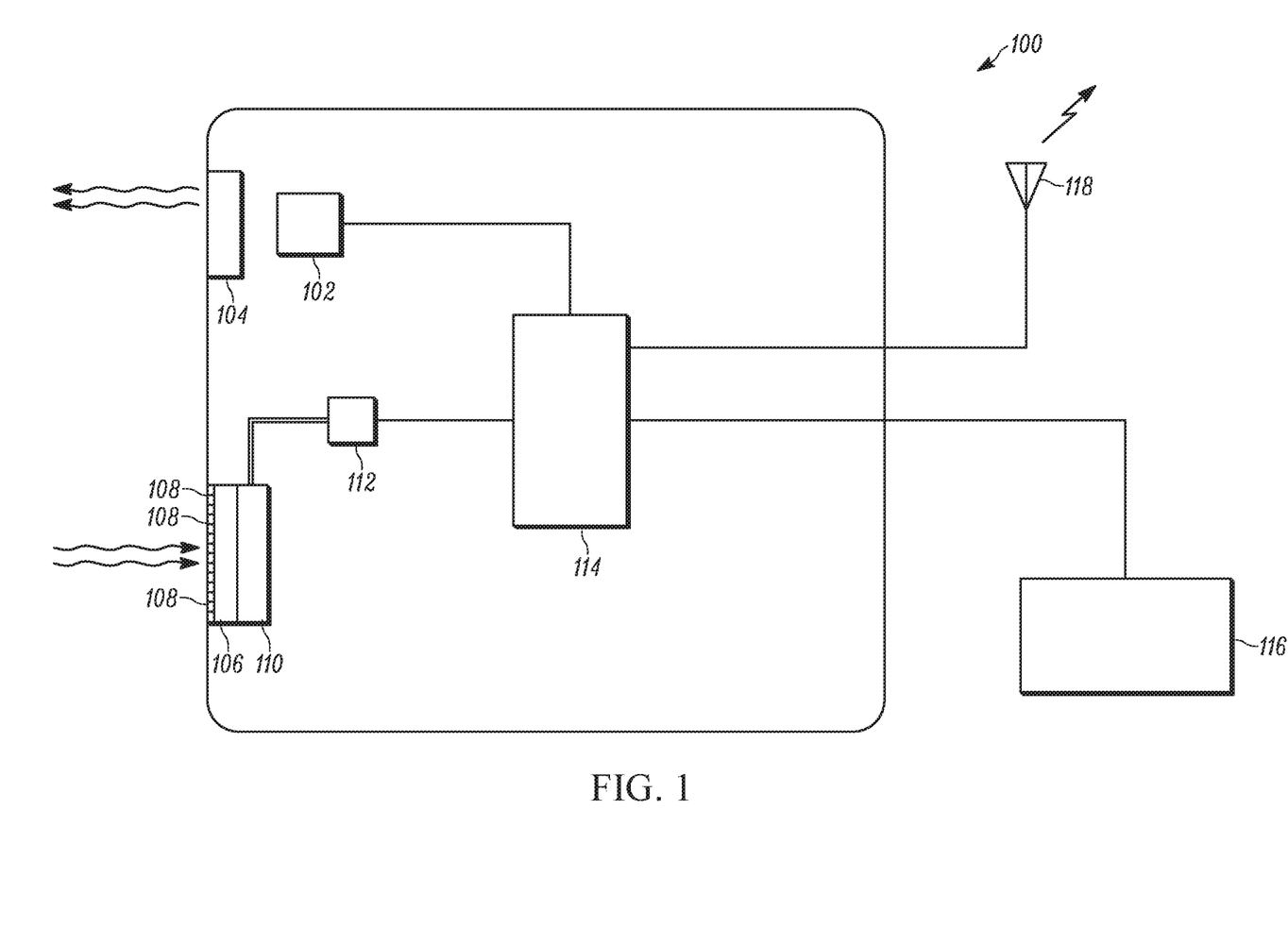
FIG. 1 is block diagram of a lidar sensor assembly according to one exemplary embodiment.

Referring to FIG. 1, the lidar sensor assembly 100, also referred to herein simply as the assembly 100, includes a laser light source 102 configured to generate light. In the exemplary embodiment, the assembly 100 includes a diffusing optic 104 to diffuse, i.e., scatter or disperse, the light focused light created by the laser light source 102, into a generally larger field-of-illumination.

The lidar sensor assembly 100 also includes a detector array 106. In operation, light produced by the laser light source 102 and diffused by the diffusing optic 104 is reflected off one or more objects in the field-of-illumination and received by the detector array 106. The detector array 106 includes a plurality of photodetectors 108. Each photodetector 108 converts received light to an electrical signal, as readily appreciated by those skilled in the art. The photodetectors 108 are arranged in a series of columns and rows with each photodetector 108 corresponding to a pixel of a generated image.

Figure 2:
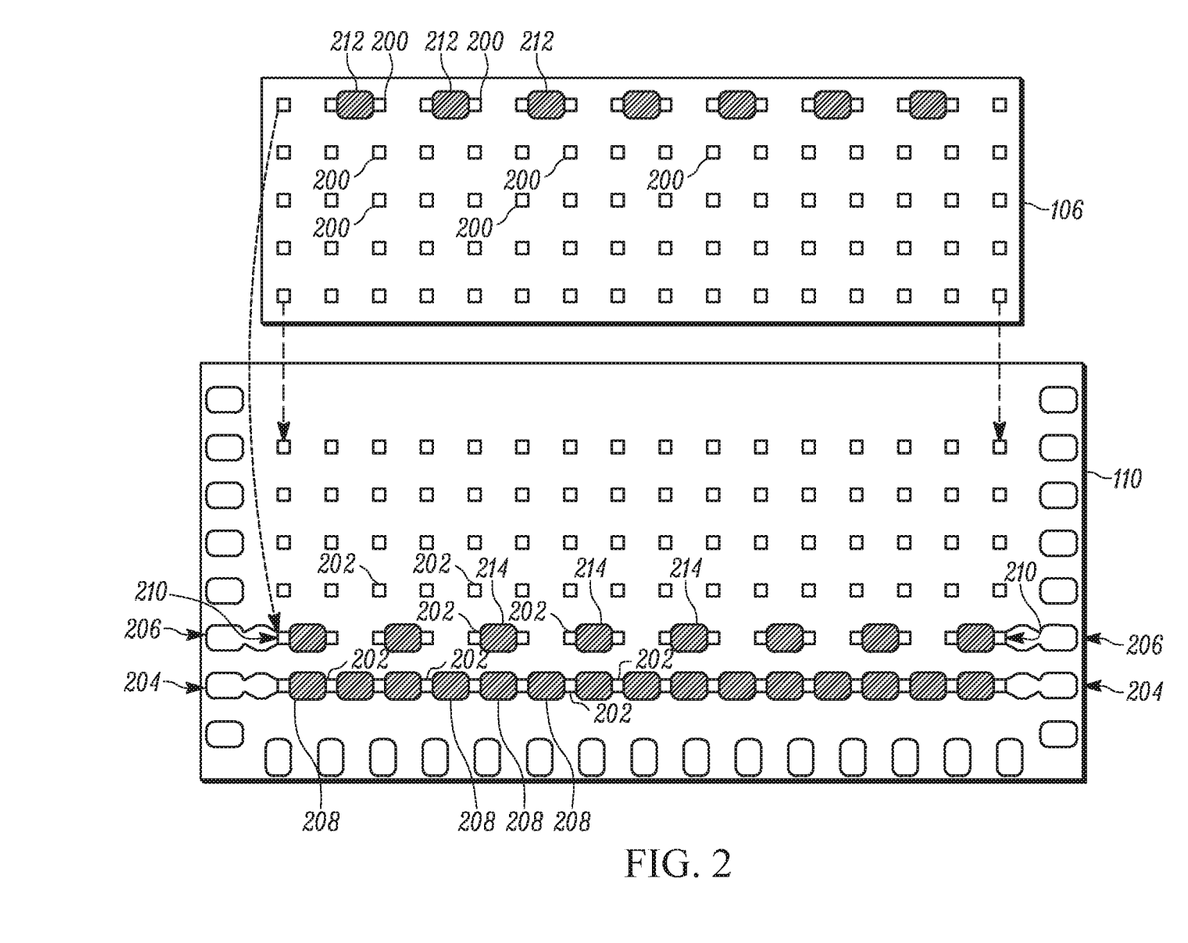
FIG. 2 is a top view of a detector array and an integrated circuit prior to assembly according to one exemplary embodiment.

Each photodetector 108 has an anode (not shown) and a cathode (not shown) as is appreciated by those of ordinary skill in the art. The cathodes are electrically connected in a substrate (not numbered) of the detector array 106 and also connected to a biasing voltage. A conductive pad 200 providing an electrical connection to each anode is shown in FIG. 2. However, as explained in greater detail below, some of the conductive pads 200 may not be electrically connected to one of the anodes.

The lidar sensor assembly 100 further includes an integrated circuit 110. The integrated circuit 110, also referred to as a readout integrated circuit ("ROIC") 110, includes a plurality of unit cells (not shown). Each unit cell is electrically connected to one of the photodetectors 108 and includes circuitry configured to receive and condition electrical signals provided by the photodetector 108. A conductive pad 202 providing an electrical connection to each unit cell is also shown in FIG. 2. However, as explained in greater detail below, some of the conductive pads 202 may not be electrically connected to one of the unit cells.

Figure 3:
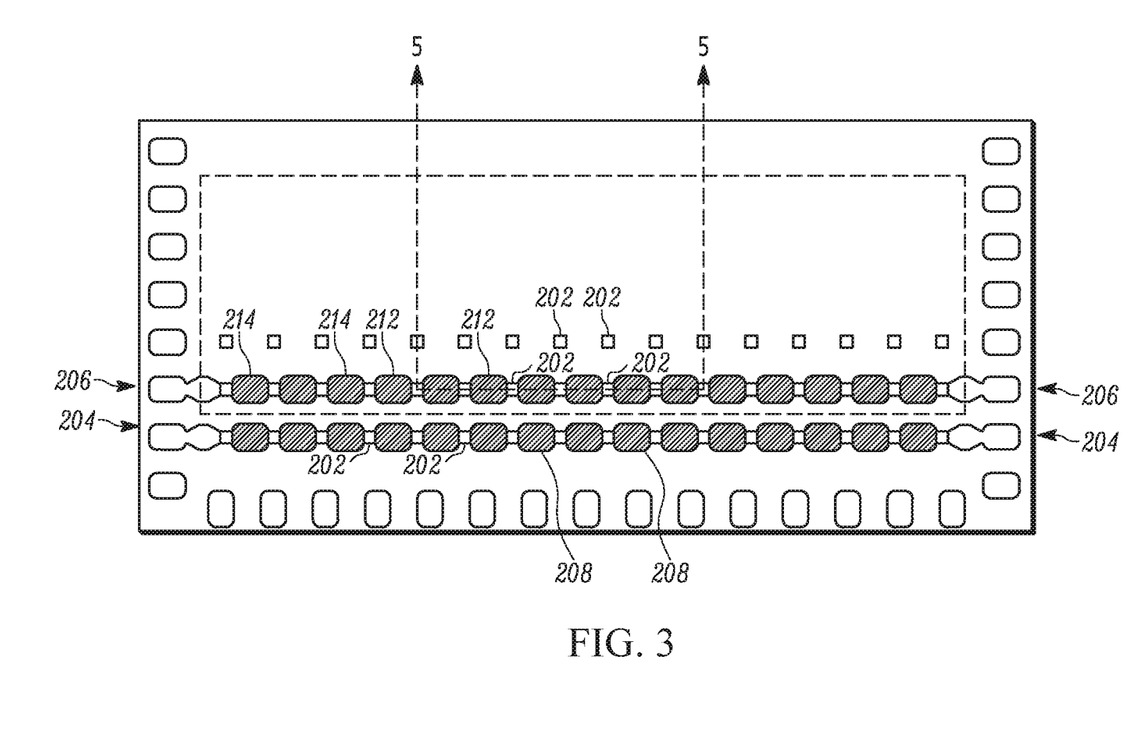
FIG. 3 is a top view of the detector array and the integrated circuit after assembly according to one exemplary embodiment.
Figure 4:
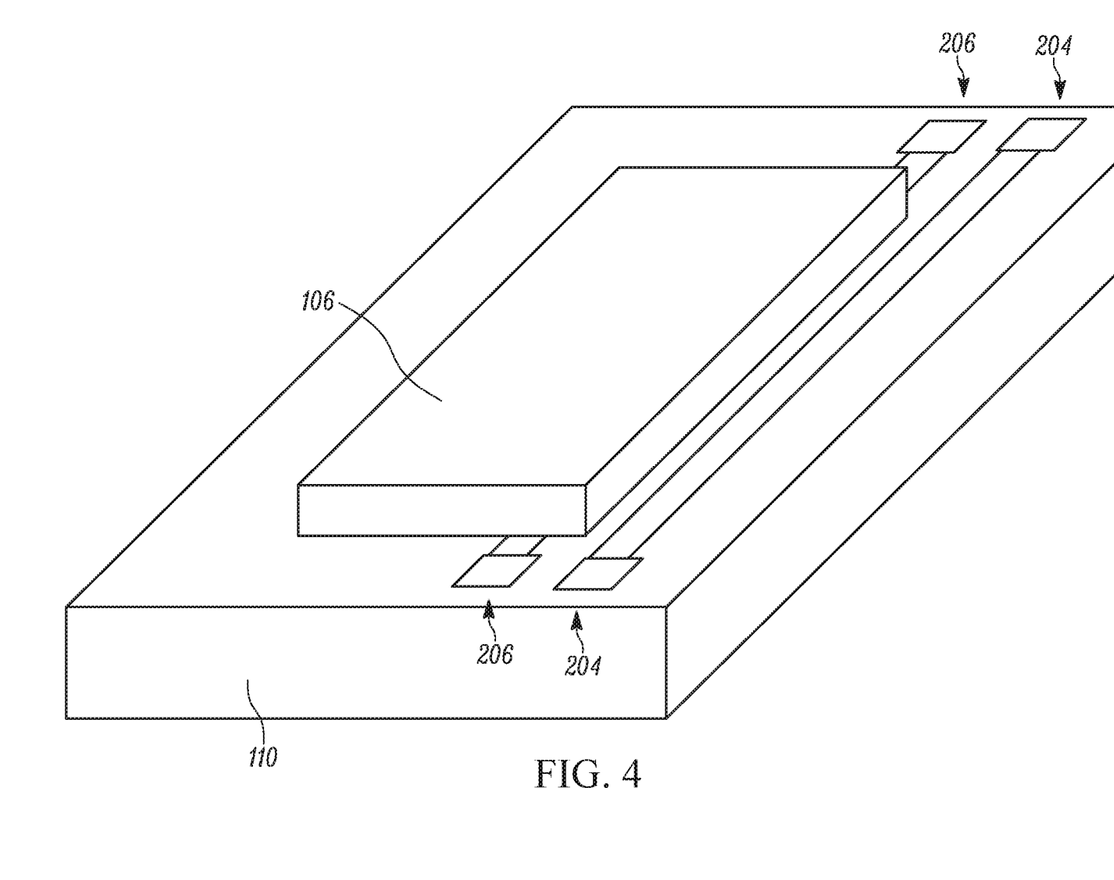
FIG. 4 is a perspective view of the detector array and the integrated circuit after assembly according to one exemplary embodiment.

FIG. 2 shows the detector array 106 and integrated circuit 110 in a pre-assembled position. To assemble, the detector array 106 is "flipped" over and bonded to the integrated circuit 110. The dashed lines on FIG. 2 show the alignment between the conductive pads 200 of the detector array 106 and conductive pads 202 of the integrated circuit 110. FIGS. 3 and 4 show the detector array 106 and integrated circuit 110 in an assembled state.

Figure 5:
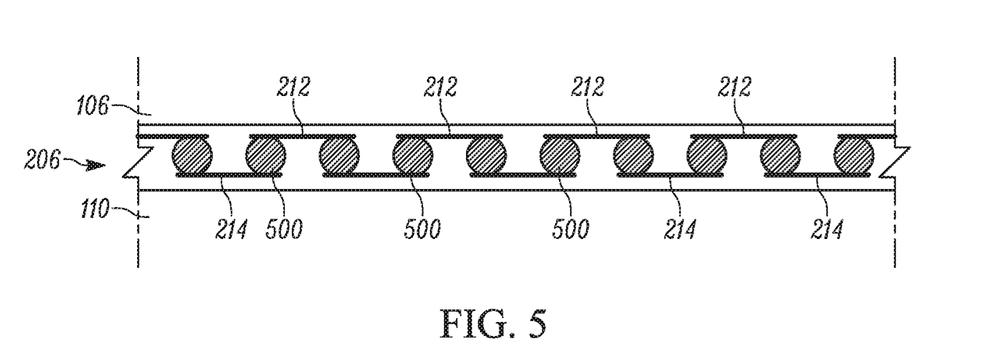
FIG. 5 is a cross-sectional view of a portion of the detector array and the integrated circuit along line 5-5 of FIG. 3 according to one exemplary embodiment.

Referring now to FIG. 5, a plurality of connection bumps 500 are utilized to selectively electrically connect the conductive pads 200 of the detector array 106 to the conductive pads 202 of the integrated circuit 110 as well as bond the detector array 106 to the integrated circuit 110. In one exemplary embodiment, the connection bumps 500 are formed of indium. Indium performs well under extremes of temperature, maintaining a soft, malleable condition event at −40° C. However, other materials may be utilized to form the connection bumps 500. Further, the connection bumps may alternate be formed as solder bumps, copper pillars, gold stud bumps, electrically conductive adhesive/epoxy, and/or any other method of high density electrical interconnect. Also, it should be noted that not every conductive pad 200, 202 is necessarily bonded with an connection bump 500.

In other embodiments, the chip-chip interconnect may also not utilize the connection bumps 500. For example, a direct bond interconnect ("DBI") may be utilized in some embodiments, wherein two flat polished surfaces on detector array 106 and integrated circuit 110 are bonded together, relying mainly on the Van der Waals forces acting on the two surfaces to create a strong mechanical and electrical connection. The DBI interconnect may be enhanced by localized surface activation. Methods of surface activation may include plasma, dry chemical etch, and hydrophilic processing.

The lidar sensor assembly 100 of the exemplary embodiment also includes a reference trace 204 and a test trace 206. Referring to FIGS. 2-4, in the exemplary embodiment, the reference trace 204 is defined by conductive material 208 on the integrated circuit 110. As best shown in FIGS. 2 and 3, the conductive material 208 is disposed on the integrated circuit 110 to electrically connect adjacent conductive pads 202 of the integrated circuit 110 along a first row 210 of conductive pads 202. In this exemplary embodiment, the conductive pads 202 are not electrically connected to unit cells, as the reference trace 204 is for testing purposes and not utilized for light sensing operation of the assembly 100. In this embodiment, the reference trace 204 is generally linear and runs generally parallel to rows of other conductive pads (not numbered) that are electrically connected to unit cells. The reference trace 204 may alternatively be disposed on the detector array 106 (not shown), instead of the integrated circuit 110.

The test trace 206 is defined by conductive material 212 on the detector array 106, at least two of the connection bumps 500, and conductive material 214 on the integrated circuit 110. In the exemplary embodiment, the test trace 206 is partially formed by conductive material 212 disposed between every other pair of conductive pads 200 on the detector array 106 and the conductive material 214 on every other pair of conductive pads 202 on the integrated circuit 110, as best seen in FIG. 2.

In the exemplary embodiment, the test trace 206 is defined through a plurality of connection bumps, and more particularly, an entire row of connection bumps 500. However, it should be appreciated that in other embodiments, the test trace 206 may run through fewer connection bumps 500, including a minimum of two connection bump 500.

Figure 6:
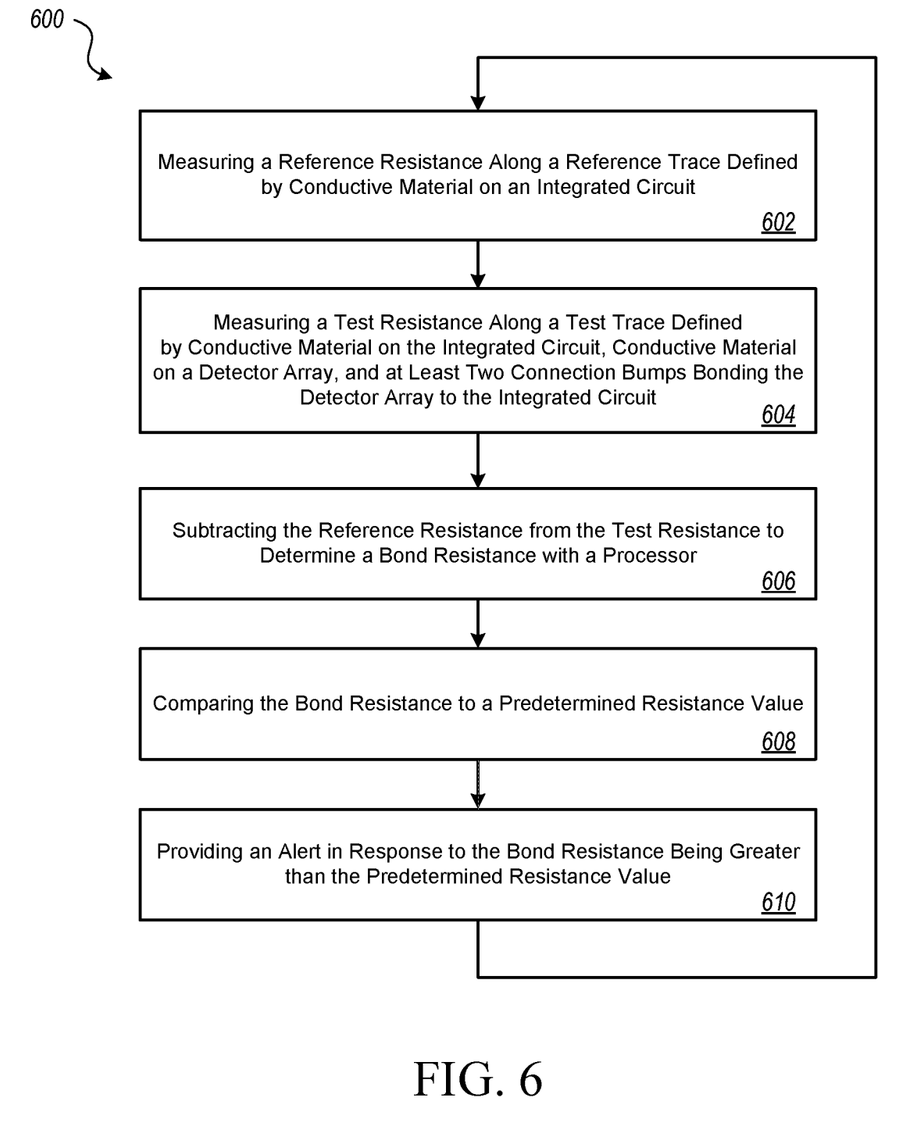
FIG. 6 is a flowchart of a method for testing the lidar sensor assembly according to one exemplary embodiment.

When assembled together, as shown in FIG. 6, the connection bumps complete formation of the test trace as electrical current may flow between the integrated circuit 110 and the detector array 106 via the bumps 500. The test trace 206 resembles a "daisy chain", as electrical current may flow back-and-forth between the integrated circuit 110 and the detector array 106, via the connection bumps 500. In this exemplary embodiment, the conductive pads 202 of the integrated circuit are not electrically connected to unit cells and the conductive pads 212 of the detector array 106 are not connected to the anodes of the photodetectors 108, as the test trace 206 is for testing purposes and not utilized for light sensing operation of the assembly 100.

Referring again to FIG. 1, the assembly 100 also includes a resistance measuring device 112. The resistance measuring device 112 is electrically connected to the reference trace 204 and the test trace 206 and configured to independently measure a reference resistance along the reference trace 204 and a test resistance along the test trace 206. Those of ordinary skill in the art appreciate numerous circuits and apparatus that may be implemented as the resistance measuring device 112.

The assembly 100 also includes a processor 114 in communication with the resistance measuring device 112. The processor 114 may be implemented with any device capable of performing calculations and/or executing a series of instructions (i.e., running a program) as is well known to those of ordinary skill in the art. For example, the processor 114 may be implemented with a microprocessor, microcontroller, application specific integrated circuit ("ASIC"), and/or other similar devices.

The processor 114 is configured to receive the reference resistance and the test resistance from the resistance measuring device 112. The processor 114 is also configured to subtract the reference resistance from the test resistance to produce a bond resistance. The bond resistance is thus generally representative of the resistance of the connection bumps 500 which form the bonds between the detector array 106 and the integrated circuit 110. This resistance may change over time due to the electrical and physical strength of the bond generated by the connection bumps 500.

The processor 114 is also configured to compare the bond resistance to a predetermined resistance value. In one embodiment, the predetermined resistance value may be a value at or near a maximum acceptable resistance for reliable operation of the assembly 100.

The processor 114 may also be configured to repeat, over time, the measuring of the reference resistance, the measuring of the test resistance, and the subtracting of the reference resistance from the test trace to determine the bond resistance. These various resistance measures and calculations may be stored in a memory (not shown) that is part of or in communication with the processor 114, as is readily appreciated to those of ordinary skill in the art.

In one exemplary embodiment, the processor 114 is also configured to compare a plurality of bond resistances over time and extrapolate at least one future bond resistance. By extrapolating at least one future bond resistance, the processor 114 may be able to calculate a predicted time, in the future, when the bond resistance reaches the predetermined resistance value. Said another way, the processor 114 may be able to predict a time until failure of the assembly 100, due to a breakdown in the electrical or mechanical properties of the connection bumps 500.

The assembly 100 may further include a human-machine interface ("HMI") 116 in communication with the processor 114. In one embodiment, the HMI may include a display (not separately shown) to provide data in visual form to a user. Of course, those of ordinary skill in the art appreciate numerous other devices that may be implemented as the HMI 116 or part of the HMI 116.

The HMI 116 is configured to produce an alert. In one embodiment, the HMI 116 may produce an alert when the bond resistance exceeds the predetermined resistance value. More particularly, when the processor 114 determines that the bond resistance is less than or equal to the predetermined resistance value, the processor 114 may instruct the HMI 116 to alert the driver, owner, and/or other person that the assembly 100 may need to be repaired and/or replaced. In another embodiment, the HMI 116 may produce an alert when the predicted time when the bond resistance may reach the predetermined maximum limit is less than a predetermined lifetime period. For example, the HMI 116 may alert the driver when it is predicted that the HMI 116 may fail within three months. Of course, other alerts may be provided by the HMI 116 as may be readily contemplated by those of ordinary skill in the art.

The assembly 100 may also include a communications interface 118, represented by an antenna symbol in FIG. 1. The communications interface 118 is in communication with the processor 114 and allows for signals, data, and/or other information to be sent from the processor 114 to another device and/or location. For example, the communications interface 118 allows the assembly 100 to send information regarding state of the connection bumps 500 to a repair service, which may then inform the owner of the vehicle the assembly 100 may need to be repaired and/or replaced.

FIG. 6 shows one exemplary embodiment of a method 600 of testing the sensor assembly 100. The method 600 includes, at 602, measuring a reference resistance along a reference trace defined by conductive material on an integrated circuit 110. The method 600 also includes, at 604, measuring a test resistance along a test trace 204 defined by conductive material on the integrated circuit 110, conductive material on a detector array 106, and at least two connection bumps 500 bonding the detector array 106 to the integrated circuit 110.

The method 600 further includes, at 606, subtracting the reference resistance from the test resistance to determine a bond resistance with a processor 114. After subtraction, the method 600 continues with, at 608, comparing the bond resistance to a predetermined resistance value. The method 600 may also include, at 610, providing an alert in response to the bond resistance being greater than the predetermined resistance value.

The method 600 may repeat over time. That is, the measuring 602, 604 of resistances, calculating 606 the bond resistance, comparing 608 the bond resistance, and providing 610 an alert may be performed numerous times to constantly check the performance of the connection bumps 500.

The method 600 may also include, but is not shown in FIG. 6, comparing a plurality of bond resistances over time and extrapolating at least one future bond resistance. The method 600 may further include, but is not shown in FIG. 6, comparing the at least one future bond resistance to the predetermined resistance value and predicting a time until failure.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A lidar sensor assembly for a vehicle comprising:
a laser light source configured to generate light;
a diffusing optic adapted to diffuse the light created by the laser light source into a field of illumination;
a detector array having a plurality of photodetectors adapted to receive the light reflected off one or more objects in the field of illumination and convert the received light to an electrical signal,
an integrated circuit electrically connected to said detector array electrically via a plurality of connection bumps;
a reference trace defined by conductive material disposed on at least one of the integrated circuit and the detector array;
a test trace defined by conductive material on the detector array, at least two of the connection bumps, and conductive material on the integrated circuit;
a resistance measuring device configured to independently measure a reference resistance along the reference trace and a test resistance along the test trace; and
a processor in communication with the resistance measuring device, said processor configured to receive the reference resistance and the test resistance, and calculate a bond resistance; and
said processor adapted to compare the bond resistance to a predetermined resistance value, determine a fault condition based on the comparison, and transmit an alert signal based on the determination of the fault condition.

2. The lidar sensor assembly of claim 1 wherein said processor is adapted to perform bond resistance calculations periodically and to predict a fault condition based on the periodic bond resistance calculations.

3. The lidar sensor assembly of claim 1 wherein said processor is adapted to store said bond resistance calculations in a memory.

4. The lidar sensor assembly of claim 1 further comprising a human-machine interface in communication with said processor and configured to signal an alert.

5. The lidar sensor assembly of claim 4 wherein said human-machine interface is a display.

6. The lidar sensor assembly of claim 4 wherein said human-machine interface is a communications interface.

7. A lidar sensor assembly for a vehicle comprising:
a laser light source configured to generate light;
diffusing optic adapted to diffuse the light created by the laser light source into a field of illumination;
a detector array having a plurality of photodetectors adapted to receive the light reflected off one or more objects in the field of illumination and convert the received light to an electrical signal,
a readout integrated circuit comprising a plurality of unit cells electrically connected to said detector array electrically via a plurality of connection bumps, said unit cells each having circuitry configured to receive and condition electrical signals provided by each photodetector;

a reference trace defined by conductive material disposed on at least one of the readout integrated circuit and the detector array;

a test trace defined by conductive material on the detector array, at least two of the connection bumps, and conductive material on the readout integrated circuit;

a resistance measuring device configured to independently measure a reference resistance along the reference trace and a test resistance along the test trace; and a processor in communication with the resistance measuring device, said processor configured to receive the reference resistance and the test resistance, and calculate a bond resistance; and said processor adapted to compare the bond resistance to a predetermined resistance value, determine a fault condition based on the comparison, and transmit an alert signal based on the determination of the fault condition.

8. The lidar sensor assembly of claim 7 wherein said processor is adapted to perform bond resistance calculations periodically and to predict a fault condition based on the periodic bond resistance calculations.

9. The lidar sensor assembly of claim 7 wherein said processor is adapted to store said bond resistance calculations in a memory.

10. The lidar sensor assembly of claim 9 wherein said processor is further configured to predict at least one future bond resistance from said bond resistance calculations stored in memory.

11. The lidar sensor assembly of claim 10 wherein said processor is further configured to predict a time until failure.

12. The lidar sensor assembly of claim 11 wherein said processor is further configured to send an alert in response to predicted time until failure being less than a predetermined value.

13. The lidar sensor assembly of claim 7 further comprising a human-machine interface in communication with said processor and configured to signal an alert.

14. The lidar sensor assembly of claim 13 wherein said human-machine interface is a display.

15. The lidar sensor assembly of claim 13 wherein said human-machine interface is a communications interface.

16. The lidar sensor assembly of claim 7 wherein said processor is selected from the set of a microprocessor, microcontroller, and an application specific integrated circuit.

* * * * *